United States Patent
Cellarosi

[11] Patent Number: 6,016,005
[45] Date of Patent: Jan. 18, 2000

[54] MULTILAYER, HIGH DENSITY MICRO CIRCUIT MODULE AND METHOD OF MANUFACTURING SAME

[76] Inventor: Mario J. Cellarosi, 14709 Plainfield Rd., Germantown, Md. 20874

[21] Appl. No.: 09/021,050

[22] Filed: Feb. 9, 1998

[51] Int. Cl.[7] .......................... H01L 23/06; H01L 23/10; H01L 23/15
[52] U.S. Cl. .......................... 257/703; 257/700; 257/706; 361/749; 174/256
[58] Field of Search ................................... 257/703, 700, 257/706, 772; 361/774, 813, 748, 749; 174/256

[56] References Cited

U.S. PATENT DOCUMENTS

| | | | |
|---|---|---|---|
| Re. 35,064 | 10/1995 | Hernandez | 361/763 |
| 2,926,340 | 2/1960 | Blain et al. | 340/174 |
| 3,436,819 | 4/1969 | Lunine | 29/628 |
| 3,465,435 | 9/1969 | Steranko | 29/628 |
| 3,516,156 | 6/1970 | Steranko | 29/627 |
| 3,617,817 | 11/1971 | Kawakatsu | 257/705 |
| 3,770,529 | 11/1973 | Anderson | 156/3 |
| 3,775,844 | 12/1973 | Parks | 29/626 |
| 3,867,759 | 2/1975 | Siefker | 29/628 |
| 3,999,004 | 12/1976 | Chirino et al. | 174/68.5 |
| 4,030,190 | 6/1977 | Varker | 29/625 |
| 4,109,377 | 8/1978 | Blazick et al. | 29/626 |
| 4,152,988 | 5/1979 | Haas et al. | 102/28 M |
| 4,237,606 | 12/1980 | Niwa et al. | 29/830 |
| 4,258,468 | 3/1981 | Balde | 29/830 |
| 4,322,778 | 3/1982 | Barbour et al. | 361/414 |
| 4,443,278 | 4/1984 | Zingher | 156/64 |
| 4,546,065 | 10/1985 | Amendola et al. | 430/313 |
| 4,567,062 | 1/1986 | Fan | 427/96 |
| 4,683,653 | 8/1987 | Iwasa | 29/830 |
| 4,685,210 | 8/1987 | King et al. | 29/830 |
| 4,702,785 | 10/1987 | Burger | 156/91 |
| 4,706,162 | 11/1987 | Hernandez et al. | 361/306 |
| 4,721,831 | 1/1988 | Vora | 174/68.5 |
| 4,734,818 | 3/1988 | Hernandez et al. | 361/306 |
| 4,736,521 | 4/1988 | Dohya | 29/830 |
| 4,772,346 | 9/1988 | Anderson, Jr. et al. | 156/89 |
| 4,860,165 | 8/1989 | Cassinelli | 361/388 |
| 4,867,935 | 9/1989 | Morrison, Jr. | 264/61 |
| 4,916,260 | 4/1990 | Broaddus et al. | 174/268 |
| 4,933,045 | 6/1990 | DiStefano et al. | 156/630 |
| 4,935,844 | 6/1990 | Burn | 361/321 |
| 4,954,313 | 9/1990 | Lynch | 419/9 |
| 4,970,106 | 11/1990 | DiStefano et al. | 428/209 |
| 4,972,253 | 11/1990 | Palino et al. | 257/705 |
| 5,006,923 | 4/1991 | Warren | 357/80 |
| 5,011,725 | 4/1991 | Foster | 428/137 |
| 5,065,284 | 11/1991 | Hernandez | 361/414 |
| 5,073,840 | 12/1991 | Coors | 361/400 |
| 5,080,966 | 1/1992 | Abe | 428/323 |
| 5,087,413 | 2/1992 | Abe | 419/9 |
| 5,118,643 | 6/1992 | Jean et al. | 501/21 |
| 5,142,775 | 9/1992 | Wiley | 29/852 |
| 5,182,632 | 1/1993 | Bechtel et al. | 257/713 |
| 5,216,207 | 6/1993 | Prabhu et al. | 174/256 |
| 5,242,713 | 9/1993 | Viehbeck et al. | 427/304 |
| 5,254,191 | 10/1993 | Mikeska et al. | 156/89 |
| 5,271,887 | 12/1993 | Wiech, Jr. | 264/61 |
| 5,276,455 | 1/1994 | Fitzsimmons et al. | 343/777 |
| 5,280,414 | 1/1994 | Davis et al. | 361/795 |
| 5,282,312 | 2/1994 | DiStefano et al. | 29/830 |

(List continued on next page.)

*Primary Examiner*—Mahshid Saadat
*Assistant Examiner*—Jhihan B Clark
*Attorney, Agent, or Firm*—Holland & Knight LLP

[57] ABSTRACT

A multilayer micro circuit module, and the method of manufacturing same, comprises a number of green sheets of ceramic material which are sintered before any other fabrication steps are undertaken. The sintered sheets are then formed with registration holes and via, and an electrically conductive pattern formed of a noble metal or copper is deposited onto one or both major surfaces of each sintered sheets. The sintered sheets are stacked one on top of the other to form a stack whose exterior surface is coated with a sealing material such as solder or glass and then fired at a temperature less than the melting point of a metal forming the conductive patterns so that the interior of the stack including the conductive patterns is substantially isolated from contaminants.

7 Claims, 2 Drawing Sheets

U.S. PATENT DOCUMENTS

| | | | |
|---|---|---|---|
| 5,283,104 | 2/1994 | Aoude et al. | 428/195 |
| 5,284,548 | 2/1994 | Carey et al. | 156/630 |
| 5,293,025 | 3/1994 | Wang | 219/121.71 |
| 5,300,735 | 4/1994 | Yokono et al. | 174/264 |
| 5,316,985 | 5/1994 | Jean et al. | 501/16 |
| 5,329,695 | 7/1994 | Traskos et al. | 29/830 |
| 5,337,466 | 8/1994 | Ishida | 29/830 |
| 5,349,743 | 9/1994 | Grader et al. | 29/602.1 |
| 5,371,654 | 12/1994 | Beaman et al. | 361/744 |
| 5,396,034 | 3/1995 | Fujita et al. | 174/261 |
| 5,403,420 | 4/1995 | Gall et al. | 156/182 |
| 5,450,290 | 9/1995 | Boyko et al. | 361/792 |
| 5,473,194 | 12/1995 | Kawai et al. | 257/774 |
| 5,480,048 | 1/1996 | Kitamura et al. | 216/13 |
| 5,499,442 | 3/1996 | Nakamura et al. | 29/600 |
| 5,543,661 | 8/1996 | Sumida | 257/707 |
| 5,545,429 | 8/1996 | Booth et al. | 427/97 |
| 5,570,504 | 11/1996 | DiStefano et al. | 29/830 |
| 5,583,321 | 12/1996 | DiStefano et al. | 174/264 |
| 5,590,460 | 1/1997 | DiStefano et al. | 29/830 |
| 5,591,941 | 1/1997 | Acocella et al. | 174/266 |
| 5,604,673 | 2/1997 | Washburn et al. | 363/147 |
| 5,615,477 | 4/1997 | Sweitzer | 29/840 |
| 5,619,791 | 4/1997 | Lambrecht, Jr. et al. | 29/852 |
| 5,640,049 | 6/1997 | Rostoker et al. | 257/758 |
| 5,710,071 | 1/1998 | Beddingfield et al. | 257/778 |

MULTILAYER, HIGH DENSITY MICRO CIRCUIT MODULE AND METHOD OF MANUFACTURING SAME

FIELD OF THE INVENTION

This invention relates to electrical circuitry, and, more particularly, to a laminate or module formed of a number of stacked sheets of dielectric material having at least one major surface carrying a pattern of electrically conductive material.

BACKGROUND OF THE INVENTION

Electrical components are commonly mounted on circuit panel structures such as printed circuit boards. Relatively large circuit panels are commonly made of polymeric materials, often with reinforcements such as glass. Very small circuit panels, such as those used to carry micro circuits including semiconductor chip carriers, are typically formed of ceramics, silicone or the like. Circuit panels of this general type have opposed, major flat surfaces, one or both of which mount electrical conductors. The conductors are commonly formed of metallic materials such as copper, noble metals, tungsten or molybdenum which serve to interconnect the electrical components mounted to the board. Where the conductors are carried on both major surfaces of a panel, via filled with electrically conductive material are formed in the dielectric layer(s) to interconnect the conductors on opposite major surfaces.

As electronic circuits have increased in complexity, concerted efforts have been made to miniaturize circuit components and to construct the circuitry in several layers of conductors separated by insulating dielectric layers. Consequently, circuit panels of the type described above have been incorporated in laminates or modules wherein a number of circuit panels are stacked one on top of the other with additional layers of dielectric material separating the conductors on mutually facing surfaces of adjacent panels. Such multilayer assemblies ordinarily incorporate interconnections extending between the components on the various circuit panels in the stack, as necessary, to provide the required electrical interconnections.

One common method for the production of micro electronic circuitry begins with the fabrication of a dielectric substrate known as a "green sheet." A particulate material, usually ceramic, is intermixed with a binder and cast onto a moving belt where a scraper or doctor blade is employed to obtain the desired thickness, e.g., on the order of 200–280 $\mu$m. In subsequent manufacturing steps, the green sheet is cut to size and undergoes a number of processing steps including the formation of registration holes and via. The via are filled with conductive material, and then electrically conductive metal paste is applied in a predetermined pattern on one or both of the major surfaces of the substrate. A number of green sheets are stacked one on top of the other, and the entire assembly is then co-fired or sintered at a temperature typically in the range of about 1250–1560° C. This co-firing operation drives off the organic binders in the green sheets and metal paste, sinters the conductive metal and densifies the dielectric material.

A number of serious deficiencies have been observed with the above described fabrication method, and in the resulting micro circuitry itself. The green sheets do not exhibit good strength and are susceptible to breakage during subsequent handling operations such as the drilling or punching of registration holes and via. Consequently, the green sheets must be made relatively thick which substantially increase the overall thickness of the module formed by stacking multiple sheets atop one another. The comparatively low strength of the green sheets also does not lend itself well to finishing operations such as grinding, polishing or the application of a finished material such as glass to the major surfaces of the sheets. Such finishing operations are desirable to avoid surface irregularities in preparation for application of the conductive coating patterns thereon.

As noted above, the green sheets and conductive coating patterns are cofired at elevated temperatures to produce the resulting multilayer micro circuit module. This cofiring operation produces a host of problems in the manufacturing process and severe limitations in the micro circuit module. Both the green sheets, and metallurgy carried on their major surfaces, densify and shrink during the firing operation. Unfortunately, shrinkage of the ceramic material forming the green sheets is often nonuniform, and differs from the shrinkage rate of the metallurgy. Different or nonuniform shrinkage among the individual ceramic sheets can create misalignment of the registration holes and/or via between adjacent sheets. This misalignment of the via, which are filled with conductive material, can result in a failure to make electrical connection between the conductive pattern on one sheet with the conductive pattern on an adjacent sheet, and/or with the conductive pattern on opposite sides of a single sheet. Although enlarging the size of the via to account for shrinkage of the ceramic sheets is an option, this reduces the surface area of the sheet available for the mounting of micro circuitry. A different rate of shrinkage between the ceramic and metallurgy may create cracking in the conductive pattern, or loss of the metal-to-ceramic adhesion.

Firing or sintering of the multilayer module is conducted at elevated temperatures to burn away the binder material contained in the green sheets and in the conductive paste. Burn-out of the binder material can produce impurities which are absorbed within or otherwise contaminate the conductive patterns, thus compromising their integrity. Additionally, the high sintering temperatures severely limits the types of metals which can be employed to form the electrically conductive patterns on the ceramic sheets. High melting point metals such as tungsten or molybdenum must be utilized to withstand the cofiring temperatures, instead of conductive material such as gold, silver, palladium and copper which exhibit lower resistance, enhanced signal propagation and lessened "cross-talk" or noise. Such deficiencies of tungsten and molybdenum limit the densities at which the conductive patterns can be applied to the ceramic sheets.

SUMMARY OF THE INVENTION

It is therefore among the objectives of this invention to provide a method of fabricating multilayer micro circuits which eliminates problems of shrinkage of the dielectric substrates or sheets, which eliminates impurities in the sintering operation, which allows for improved surface finish on the major surfaces of the dielectric sheets, which permits the use of noble metals to form the conductive patterns, which allows for densification of the micro circuitry, and, which protects the micro circuitry from contaminants.

These objectives are accomplished in a method according to this invention which is predicated upon the concept of forming a number of green sheets in a conventional manner, but firing them at the appropriate temperature before any other fabrication operations are conducted. After firing of the green sheets, registration holes and via are formed by ultrasonic, high pressure water jet, isostatic punching or laser techniques. The via are then filled with a conductive metal, after which time a conductive pattern is deposited on one or both of the major surfaces of each sintered sheet using noble metals or copper. The individual sheets are stacked one on top of the other using the registration holes for proper alignment. The exterior surfaces of the entire stack or module are then coated with a glass material, solder or other sealing material to substantially completely encase the conductive patterns on the inside of the stack. Lastly, the entire assembly or module is fired at a temperature sufficient to crystallize the sealing material, but at a temperature below the melting point of the noble metals or copper forming the conductive patterns.

A substantial number of advantages are achieved with the above described method of forming a multilayer micro circuit compared to techniques employed in the past. Many of these advantages are obtained by sintering or firing the green sheets of ceramic material before any other operations are conducted. Sintered sheets are stronger than green sheets, and subsequent operations of drilling or punching registration and via holes are therefore simplified. Sintered sheets can also be more readily ground, polished or otherwise surface treated in preparation for the receipt of conductive patterns, as compared to green sheets. Problems due to uneven and unpredictable shrinkage of the green sheets are eliminated with the method of this invention, including, but not limited to, non-alignment of the registration holes, interruption of the electrical connection between the conductive patterns and via, cracking of the conductive coating patterns, failure of adhesion between the ceramic and conductive patterns, and others.

Sintering of the green sheets prior to the formation of a multilayer stack permits the use of noble metals and copper in the electrical patterns on the sheets instead of high melting point metals such as molybdenum and tungsten. Although the stack is fired to crystallize the surrounding sealing material, as described above, such firing temperature is below the melting point of copper or noble metals. As noted above, copper and noble metals have lower electrical resistance, improved signal propagation, reduced cross-talk or noise and many other advantages compared to molybdenum and tungsten. Consequently, the micro circuitry on each sheet may be densified in the module resulting from the method of this invention, thus reducing the number of sheets required in a given "stack" or module, and, in turn, making heat extraction more simple and efficient.

The provision of a sealing material, such as solder or glass, provides a further advantage over known multilayer modules. The sealing material effectively isolates each of the ceramic sheets, and the conductive pattern on one or both of the major surfaces thereof throughout the entire module. This additional protection of the module is achieved without undergoing a firing operation in excess of the melting temperature of the noble metals forming the conductive patterns.

DESCRIPTION OF THE DRAWINGS

The structure, operation and advantages of the presently preferred embodiment of this invention will become further apparent upon consideration of the following description, taken in conjunction with the accompanying drawings, wherein.

DETAILED DESCRIPTION OF THE INVENTION

Figure 1:
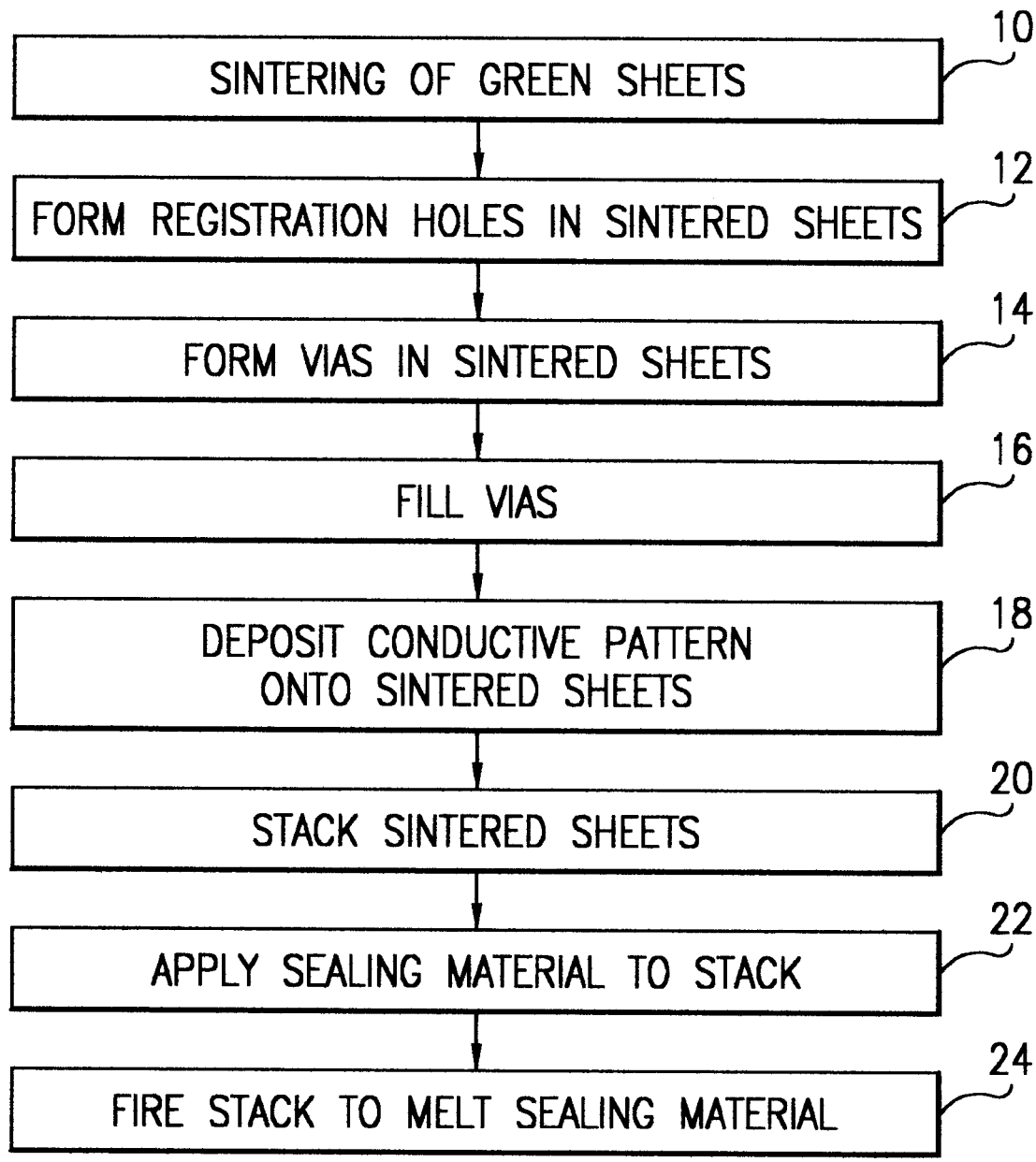
FIG. 1 is a block diagram flow chart of the method steps of this invention.

With reference initially to FIG. 1, the method steps of this invention are schematically depicted in block diagram form for ease of illustration and discussion. Except as noted below, details of the individual method steps form no part of this invention, and therefore are discussed only briefly herein.

An important aspect of this invention is depicted in block 10 entitled "Sintering of Green Sheets." The green sheets themselves are formed by conventional techniques in a manner described above wherein a slurry of ceramic particulate material and a binder material are combined and then processed to form a thin sheet. The term "ceramic" as used herein applies to essentially any commercially available particulate ceramic material, CVD ceramics, ceramic composite materials, diamond or synthetic diamond materials, coated ceramics and all classes of glass ceramic materials. The resulting sheets produced from the slurry are known as "green sheets." The green sheets are fired or sintered at temperatures typically on the order of about 1250–1560° C. causing the organic binder material to be driven off and the ceramic to be densified. The resulting sintered sheet has opposed major surfaces, described in more detail below in connection with a description of FIG. 2, and a circumference of essentially any desired configuration. The sintered sheets may also be produced by slicing or sawing of sintered bulk material, sheets heat treated to secondary firing cycles below the sintering temperatures to obtain parallel and flat surfaces, and, sheets ground and/or polished to yield controllable smooth and flat surface finishes.

After the green sheets have been sintered, "drilling" or forming operations depicted schematically in blocks 12 and 14 are performed. Registration holes are formed in each sheet for purposes of aligning adjacent sheets with one another when fabricating the "stack" or module as described below. Each of the sheets is also provided with a number of via, with densities or spacing appropriate for the intended density of the micro circuitry to be deposited on the sheet. Preferably, the registration holes and via are formed using ultrasonic, high pressure water jet, isostatic punching and/or laser forming techniques. All of these forming operations are well known in the art, and the details of the same form no part of this invention.

The via within each individual sheet are filled with a conductive metal, e.g., paste, pins, semi-molten or molten metal, preferably formed of copper, or one of the noble metals such as gold, silver or palladium. See block 16. The via provide an electrical path between micro circuitry on the opposed major surfaces of a single sheet, and/or between micro circuitry on adjacent sheets within the module.

As depicted in block 18, conductive patterns are then deposited onto one or both of the major surfaces of each sheet using techniques such as photolithography, x-ray lithography and others. Because the sheets have been previously sintered, the conductive patterns are preferably comprised of copper or noble metals. As discussed above, these metals provide significant advantages compared to high melting point metals such as molybdenum and tungsten, including reduced electrical resistance, enhanced signal propagation and lessened "cross talk" or noise within the microcircuit. Consequently, high density microelectric patterns can be deposited onto the sheets, down to the micrometer size or less depending on surface conditions and finish. Further, conductive patterns can be deposited on both of the major sides of each sheet to accommodate special micro circuit designs, as desired.

In the presently preferred embodiment, the deposition of conductive patterns onto the individual sheets is preferably performed in an ultra clean environment to avoid contamination. The sheets carrying the conductive patterns remain in such ultra clean environment during the performance of the next method step depicted in block 20. In that step, the sheets are stacked one atop the other using the registration holes for alignment so that the via are in proper registration with one another in the finished module. Once the stack is formed in the manner described above, a solder or glass material is applied to the entire exposed or outside surface of the stack as depicted in block 22. The terms "exterior," or "outside surface" of the stack are meant to refer to the major surfaces of the two sheets forming the uppermost and lowermost boundaries of the stack, and the complete vertical extent of the stack around its entire circumference. The sealing material therefore completely seals the "interior" of the stack wherein the conductive patterns are located. In order to ensure no contamination of the conductive patterns, the application of the sealing material to the stack is also preferably accomplished in an ultra clean environment.

Once the stack has been coated with sealing material, it is fired as depicted in block 24 to a temperature sufficient to allow the sealing material to crystallize. In the case of sealing glasses, for example, this firing temperature is on the order of about 400° C., and well below the melting temperature of copper or noble metals.

Figure 2:
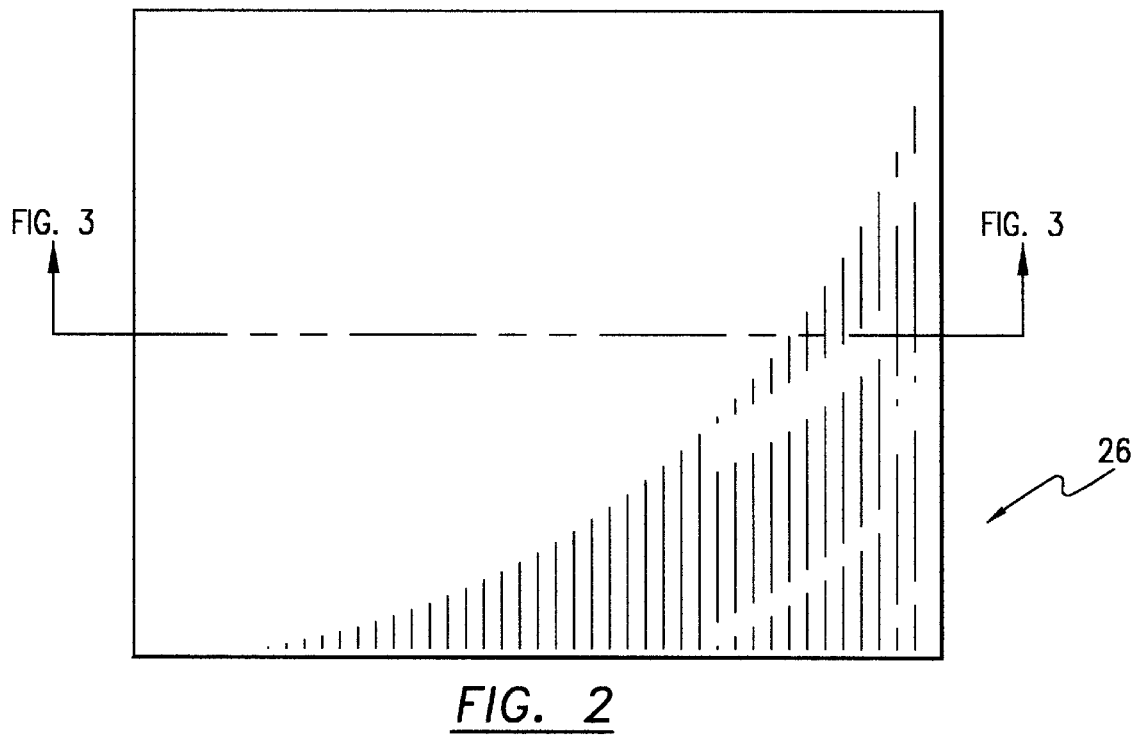
FIG. 2 is a plan view of the module of this invention.
Figure 3:
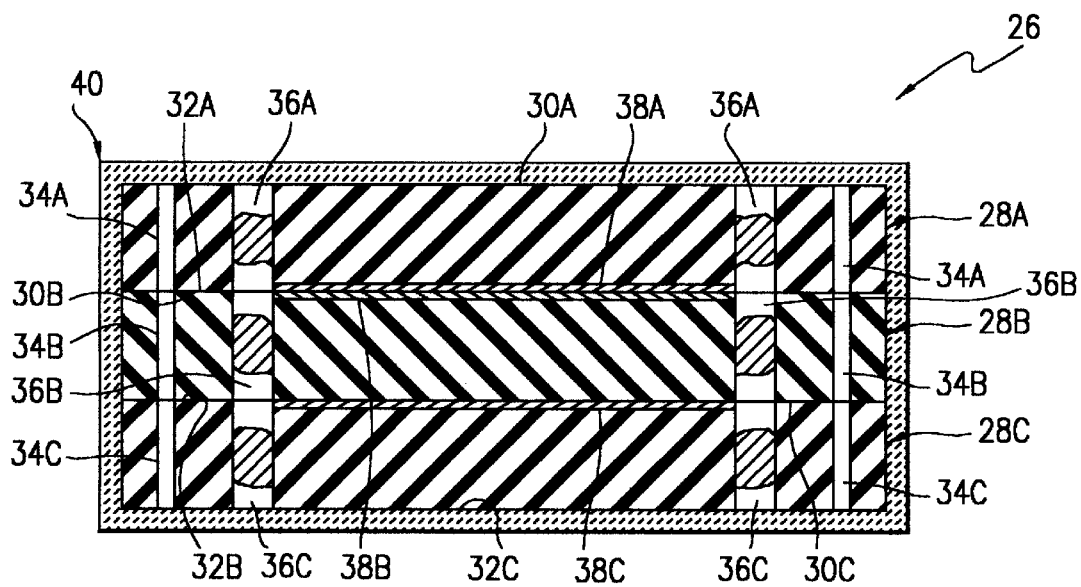
FIG. 3 is a schematic, cross-sectional view taken generally along line 3—3 of FIG. 2 depicting the multilayer module formed in accordance with the method of this invention.

Referring now to FIGS. 2 and 3, the module 26 which results from the fabrication method described above is schematically depicted. For purposes of illustration, the module 26 is shown as including three layers or sheets 28A, 28B, 28C, each having opposed major surfaces 30A, 30B, 30C and 32A, 32B, 32C, respectively. The respective sheets are formed with registration holes 34A, 34B, 34C and 36A, 36B, 36C, at locations and densities appropriate for the particular conductive pattern to be applied thereto. Each of the via 36A, 36B and 36C are filled with a conductive material, a portion of which is schematically shown in FIG. 3. For purposes of illustration, conductive patterns 38A, 38B, 38C are depicted on selected major surfaces of the sheets 28A, 28B, 28C as shown.

The entire exterior surface of the module 26 is coated with a continuous protective layer 40 formed of a sealing material such as solder, glass material or the like. This "exterior surface" is defined by the major surface 30A of sheet 28A, the major surface 32C of sheet 28C, and the entire peripheral or circumferential extent of the module 26 between the surfaces 30A and 32C. The protective layer 40 effectively isolates the conductive patterns 38A, 38B, 38C which are located on the "interior" of the module 26.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof.

For example, while only three layers or sheets 28A, 28B, 28C are depicted in the module 26 shown in FIG. 2, it should be understood that many additional sheets could be incorporated within the module 26 depending upon the requirements of a particular microelectric circuit.

Therefore, it is intended that the invention not be limited to the particular embodiment disclosed as the best mode contemplated for carrying out this invention, but the invention will include all embodiments falling within the scope of the appended claims.

What is claimed is:

1. A multilayer circuit assembly, comprising:

a number of sintered sheets formed of a dielectric material, each of said sintered sheets having opposed major surfaces and a periphery, said each of said sintered sheets being formed with a selected density of registration holes and via;

a number of electrically conductive patterns each deposited onto a major surface of one of said sintered sheets;

said sintered sheets being vertically stacked on top of one another to form a stack, said via within said sintered sheets being filled with an electrically conductive material and at least some of said via in said each sintered sheet being positioned in electrical contact with said electrically conductive patterns deposited on adjacent sintered sheets within said stack of sintered sheets, said stack having an exterior surface defined by a first major surface of the uppermost sintered sheet in said stack, a second major surface of the lowermost sintered sheet in said stack and the combined peripheries of said individual sintered sheets extending between said first and second major surfaces;

a sealing material applied to said exterior surface of said stack to substantially isolate said electrically conductive patterns from contamination.

2. The multilayer circuit assembly of claim 1 in which said sintered sheets are formed of a ceramic material.

3. The multilayer circuit assembly of claim 1 in which said electrically conductive patterns are formed of copper.

4. The multilayer circuit assembly of claim 1 in which said electrically conductive patterns are formed of a metal chosen from the group consisting of gold, silver and palladium.

5. The multilayer circuit assembly of claim 1 in which said sealing material is melted onto said exterior surface of said stack, said sealing material having a lower melting point than that of said electrically conductive patterns.

6. The multilayer circuit assembly of claim 1 in which said sealing material is solder.

7. The multilayer circuit assembly of claim 1 in which said sealing material is glass.

* * * * *